United States Patent
Prestwich

(10) Patent No.: US 6,850,427 B1
(45) Date of Patent: Feb. 1, 2005

(54) SINGLE TRANSISTOR DIFFERENTIAL ROM

(75) Inventor: Blaine Prestwich, Longmont, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 112 days.

(21) Appl. No.: 10/414,067

(22) Filed: Apr. 14, 2003

(51) Int. Cl.[7] .................................. G11C 17/00
(52) U.S. Cl. .................... 365/104; 365/94; 365/226
(58) Field of Search .................... 365/104, 94, 226

(56) References Cited

U.S. PATENT DOCUMENTS 6,735,109 B2 * 5/2004 Jo .............................. 365/149

* cited by examiner

Primary Examiner—Richard Elms
Assistant Examiner—Pho M. Luu
(74) Attorney, Agent, or Firm—Toler, Larson & Abel, LLP

(57) ABSTRACT

A single transistor memory storage element has a transistor contact connected to only one of two bitlines to program a logical value for the respective bit, pulling the connected bitline away from a bitline bias voltage and creating a voltage difference between the two bitlines. A differential sense amplifier may be employed to read the programmed bit value by sensing the magnitude or polarity of the voltage difference across the two bitlines. The read only memory is thus small, suitable for embedded read only memory, but may be read quickly.

17 Claims, 2 Drawing Sheets

400

SINGLE TRANSISTOR DIFFERENTIAL ROM

TECHNICAL FIELD OF THE INVENTION

The present invention is directed, in general, to read only memories and, more specifically, to high speed, differential read only memories.

BACKGROUND OF THE INVENTION

Embedded read only memories (ROMs) are widely utilized within processors. Such memories need to be both small in size and fast in operation. Embedded ROMs typically use a single transistor for each bit position, connected to a single bitline or not connected to the bitline for a logical one or zero at the respective bit position. However, the sensing device then needs to distinguish if the connection exists during a read. Typically the connection is sensed by detecting a significant pull-down on the bitline, which often involves waiting a significant period for transistor transition and/or settling times to elapse.

Other ROM designs employ two or more transistors for each bit position or storage cell within the memory to create a differential signal on two bitlines, allowing a very fast differential sense-amp quickly capture the value to be read. However, such a multi-transistor bit storage element is more costly in the size of the embedded memory.

There is, therefore, a need in the art for a memory permitting differential sensing with a single transistor bit element.

SUMMARY OF THE INVENTION

To address the above-discussed deficiencies of the prior art, it is a primary object of the present invention to provide, for use in a processor or data processing system, a single transistor memory storage element having a transistor contact connected to only one of two bitlines to program a logical value for the respective bit, pulling the connected bitline away from a bitline bias voltage and creating a voltage difference between the two bitlines. A differential sense amplifier may be employed to read the programmed bit value by sensing the magnitude or polarity of the voltage difference across the two bitlines. The read only memory is thus small, suitable for embedded read only memory, but may be read quickly.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
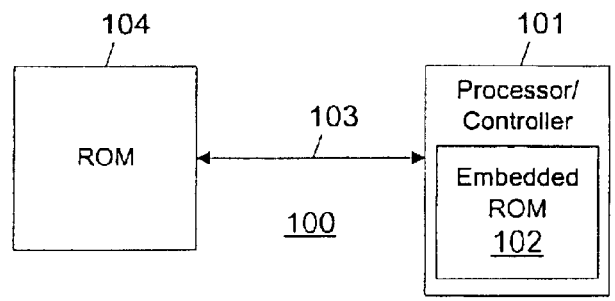
FIG. 1 depicts a data processing system employing a differentially sensed single transistor storage element read only memory according to one embodiment of the present invention.

FIG. 1 depicts a data processing system employing a differentially sensed single transistor storage element read only memory according to one embodiment of the present invention. Those skilled in the art will recognize that the full construction and operation of a data processing system and the components therein is not depicted or described herein. Instead, for simplicity and clarity, only so much of the construction and operation of a data processing system and its components as is unique to the present invention or necessary for an understanding of the present invention is depicted and described.

Data processing system 100 includes a processor or controller 101. (For the purposes of the present invention, "processor" and "controller" are used inter-changeably). Processor 101 includes an embedded read only memory 102, and in the exemplary embodiment is coupled by a bus (or crossbar or similar data communications structure) 103 to an external read only memory 104.

Figures 2A, 2B:
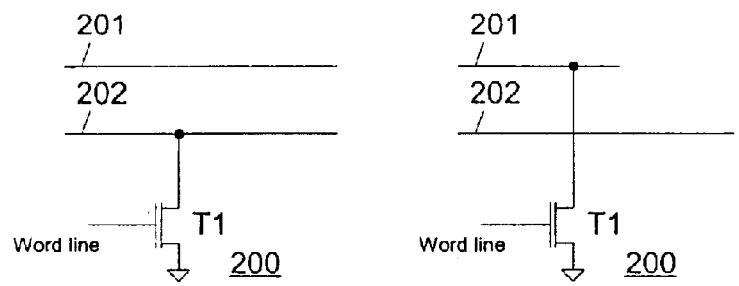
FIGS. 2A and 2B are circuit diagrams for a differentially sensed single transistor bit storage element within a read only memory according to one embodiment of the present invention.

FIGS. 2A and 2B are circuit diagrams of a differentially sensed single transistor bit storage element within a read only memory according to one embodiment of the present invention. The structure depicted may be employed within embedded ROM 102, external ROM 104, or both.

Storage element 200 includes a single transistor T1 having a contact that is selectively connected to one of a pair of bitlines 201 and 202. Connection of the transistor T1 to one bitline 201 defines a first logical value (e.g., zero) for the respective bit, while connection of the transistor T1 to the other bitline 202 defines a second logical value (e.g., one) for that bit. Connection of the transistor T1 to one of the bitlines 201 or 202 allows a strong signal to be transferred to that bitline. During a read, a differential sense-amp can quickly capture the data being read on the differential bitline pair 201 and 202, either by detecting a relative voltage on one bitline with respect to another or by merely detecting a polarity of a voltage drop across the bitlines.

In the example shown, bitlines 201 and 202 are presumed to be charged to an upper power supply voltage, with one of the bitlines pulled down toward a ground voltage by connection through transistor T1. However, bitlines 201 and 202 may alternatively be grounded, with transistor T1 pulling up one bitline by connection toward a power supply voltage. In yet another embodiment, a voltage may be applied to both the bitlines, with the transistor (T1) pulling one bitline up or down toward a different (positive or negative) voltage. In any of these embodiments, transistor T1 may be a suitably configured n channel or p channel device. A metal oxide semiconductor field effect transistor (MOSFET) is preferably employed for transistor T1 for implementation of storage element 200 within a small area.

Figures 3A, 3B, 3C:
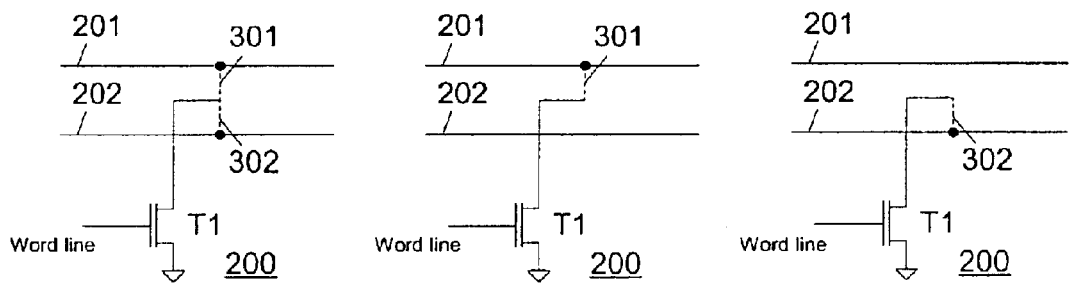
FIGS. 3A through 3C illustrate fabrication of a programmable differentially sensed single transistor bit storage element within a read only memory according to one embodiment of the present invention.

FIGS. 3A through 3C illustrate fabrication of a programmable differentially sensed single transistor bit storage element within a read only memory according to one embodiment of the present invention. Each storage element 200 within a read only memory may be fabricated to define a logical value for the respective bit by patterning, within the interconnect metallization level(s), connection of the transistor contact to a respective bitline 201 or 202. Alternatively, a suitably fabricated storage element 200 may be programmed after fabrication (but before packaging).

For a programmable storage element 200, transistor T1 is fabricated with connections 301 and 302 to both bitlines 201 and 202, respectively. After complete fabrication of a functional integrated circuit, but before packaging is complete, one of connections 301 and 302 may be removed by, for example, laser trimming, to complete programming of the logical value for the respective bit. The remaining connection 301 or 302 and the corresponding bitline 201 or 202 to which transistor T1 is connected defines the logical value for that bit.

Figure 4:
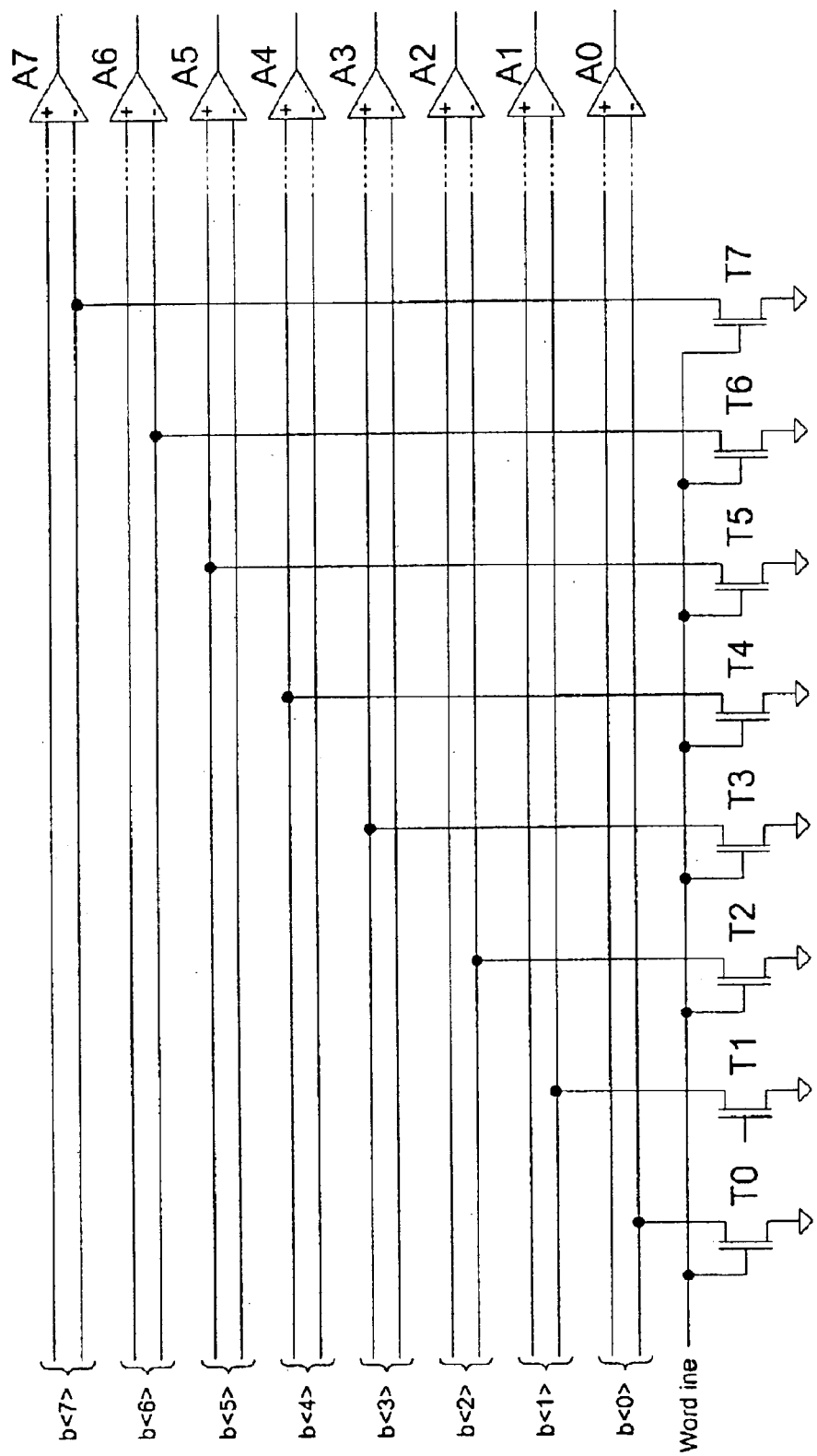
FIG. 4 is a circuit diagram for a portion of a differentially sensed single transistor storage element read only memory according to one embodiment of the present invention.

FIG. 4 is a circuit diagram for a portion of a differentially sensed single transistor storage element read only memory according to one embodiment of the present invention. ROM 400 includes a single transistor storage element T0–T7 for each of a plurality of bits <0:7> determined from bitline pairs b<0> to b<7> using differential sense amplifiers A0–A7. Those skilled in the art will recognize that selection and routing circuitry may be placed between bitline pairs b<0> to b<7> and differential sense amplifiers A0–A7 to allow reuse of differential sense amplifiers A0–A7 in reading other bytes (or words or rows) of ROM 400.

A differentially sensed single transistor storage element read only memory in accordance with the present invention provides a very small embedded structure with single transistor contact programming, but also allows a very fast differential read.

Although the present invention has been described in detail, those skilled in the art will understand that various changes, substitutions, variations, enhancements, nuances, gradations, lesser forms, alterations, revisions, improvements and knockoffs of the invention disclosed herein may be made without departing from the spirit and scope of the invention in its broadest form.

What is claimed is:

1. A memory storage element comprising:
   first and second bitlines for reading a bit; and
   a single transistor selectively connected to only one of the first and second bitlines, wherein the bit has a first logical value if the transistor is connected to the first bitline and a second logical value if the transistor is connected to the second bitline.

2. The memory storage element according to claim 1, wherein the bit is read by sensing a magnitude of a voltage difference between the first and second bitlines.

3. The memory storage element according to claim 1, wherein the bit is read by sensing a polarity of a voltage difference between the first and second bitlines.

4. A read only memory including a plurality of memory storage elements according to claim 1.

5. The read only memory according to claim 4, wherein each memory storage element includes the single transistor connected to both the first and second bitlines.

6. The read only memory according to claim 5, wherein the read only memory is programmed by removal of a connection the transistor to one of the first and second bitlines for each memory storage element.

7. A processor including at least one memory storage element according to claim 1, the processor comprising:
   an embedded read only memory having a plurality of memory storage elements each comprising a single transistor selectively connected to only one of first and second bitlines for a respective memory storage element.

8. A data processing system including at least one memory storage element according to claim 1, the data processing system comprising:
   a processor;
   an embedded read only memory communicably coupled to the processor and having a plurality of memory storage elements each comprising a single transistor selectively connected to only one of first and second bitlines for a respective memory storage element.

9. A method of programming a memory storage element comprising:
   selectively connecting a single transistor to only one of first and second bitlines for a bit, wherein the bit has a first logical value if the transistor is connected to the first bitline and a second logical value if the transistor is connected to the second bitline.

10. The method according to claim 9, further comprising:
    reading the bit by sensing a magnitude of a voltage difference between the first and second bitlines.

11. The method according to claim 9, further comprising:
    reading the bit by sensing a polarity of a voltage difference between the first and second bitlines.

12. A method of reading a memory storage element comprising:
    sensing a voltage difference between first and second bitlines for a bit, wherein a single transistor is selectively connected to only one of the first and second bitlines;

interpreting a first voltage difference between the first and second bitlines produced by connection of the transistor to the first bitline as a first logical value for the bit; and interpreting a second voltage difference between the first and second bitlines produced by connection of the transistor to the second bitline as a second logical value for the bit.

13. The method according to claim 12, further comprising:

sensing a magnitude of the voltage difference between the first and second bitlines.

14. The method according to claim 12, further comprising:

sensing a polarity of the voltage difference between the first and second bitlines.

15. For use with a differential sensing circuit, a memory storage element consisting of:

a single transistor selectively connected to one of first and second bitlines, wherein a bit stored in the memory storage element has a first logical value if the transistor is connected to the first bitline and a second logical value if the transistor is connected to the second bitline.

16. The memory storage element according to claim 15, wherein the bit may be read by sensing a magnitude, a polarity, or both of a voltage difference between the first and second bitlines.

17. A read only memory comprising a plurality of memory storage elements according to claim 15, the read only memory further comprising:

at least one differential sense amplifier that may be selectively connected to the first and second bitlines.

* * * * *